(12) United States Patent
Kinget et al.

(10) Patent No.: US 7,884,658 B2
(45) Date of Patent: Feb. 8, 2011

(54) CIRCUITS FOR FORMING THE INPUTS OF A LATCH

(75) Inventors: Peter Kinget, Summit, NJ (US); Shih-an Yu, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 34 days.

(21) Appl. No.: 12/060,190

(22) Filed: Mar. 31, 2008

(65) Prior Publication Data

US 2008/0303557 A1 Dec. 11, 2008

Related U.S. Application Data

(60) Provisional application No. 60/920,908, filed on Mar. 30, 2007, provisional application No. 60/957,066, filed on Aug. 21, 2007.

(51) Int. Cl.
*H03K 3/356* (2006.01)
(52) U.S. Cl. .................. 327/208; 327/218; 326/112
(58) Field of Classification Search .................. 327/218, 327/208; 326/112
See application file for complete search history.

(56) References Cited

U.S. PATENT DOCUMENTS 5,644,266 A * 7/1997 Chen et al. .................. 327/534
6,407,585 B1 * 6/2002 Vinh ............................ 326/98
2003/0122603 A1 * 7/2003 Green ........................ 327/218
2003/0141912 A1 * 7/2003 Sudjian ...................... 327/208

OTHER PUBLICATIONS

"IEEE 802.15.1-2002 Standard." p. 35. 2002.
Chatterjee, S. et al., "0.5-V analog circuit techniques and their application in OTA and filter design." Solid-State Circuits, IEEE Journal of, vol. 40, No. 12, pp. 2373-2387, 2005.
De Muer, B. et al., "A 1.8 GHz highly-tunable low-phase-noise CMOS VCO," Custom Integrated Circuits Conference, 2000. CICC. Proceedings of the IEEE 2000, pp. 585-588, 2000.
Deen, M. et al., "Low-power CMOS integrated circuits for radio frequency applications," Circuits, Devices and Systems, IEE Proceedings, vol. 152, No. 5, pp. 509-522, 2005.

(Continued)

*Primary Examiner*—Lincoln Donovan
*Assistant Examiner*—John W Poos
(74) *Attorney, Agent, or Firm*—Byrne Poh LLP

(57) ABSTRACT

Circuits for forming the inputs of a latch are provided. In some embodiments, circuits for forming inputs of a latch comprise: a first transistor having a first gate terminal, a first drain terminal, a first source terminal, a first gate length, and a first common mode level at the first gate terminal, wherein the first gate terminal provides a data input to the latch; and a second transistor having a second gate terminal, a second drain terminal, a second source terminal, a second gate length, and a second common mode level at the second gate terminal, wherein the second gate terminal provides a clock input to the latch, the second drain terminal is coupled to the first source terminal, and the first gate length and the second gate length are sized so that the first common model level and the second common mode level are substantially equal.

19 Claims, 14 Drawing Sheets

OTHER PUBLICATIONS

Ji-Ren, Y., "A true single-phase-clock dynamic CMOS circuit technique," Solid-State Circuits, IEEE Jornal of, vol. 22, No. 5, pp. 899-901, 1987.

Kinget, P. "A fully integrated 2.7 V 0.35 μm CMOS VCO for 5 GHz wireless applications," Solid-State Circuits Conference, 1998. Digest of Technical Papers, 45th ISSCC 1998 IEEE International, pp. 226-227, 1998.

Kral, A. et al., "RF-CMOS oscillators with switched tuning," Custom integrated Circuits Conference, 1998., Proceedings of the IEEE 1998, pp. 555-558, 1998.

Lam, C. et al., "A 2.6-GHz/5.2-GHz frequency synthesizer in 0.4-μm , CMOS technology." Solid-State Circuits. IEEE Journal of. vol. 35, No. 5, pp. 788-794, 2000.

Leenaerts, D. et al., "A 15-mW Fully Integrated I/Q Synthesizer for Bluetooth in 0.18 μm CMOS," IEEE J. Solid-State Circuits, vol. 38, pp. 1155-1162, 2003.

Meninger, S. et al., "A Fractional-N Frequency Synthesizer Architecture Utilizing a Mismatch Compensated PFD/DAC Structure for Reduced Quantization-Induced Phase Noise," IEEE Transactions On Circuits and SystemsXIII: Analog and Digital Signal Processing, vol. 50, No. 11, p. 839, 2003.

Narendra, S. et al., "Ultra-low voltage circuits and processot in 180nm to 90 nm technologies with a swapped-body biasing technique," IEEE International Solid State Circuits Conference, Feb. 2004.

Park, C, et al., "A 1.8-GHz self-calibrated phase-locked loop with precise I/Q matching," Solid-State Circuits, IEEE Journal of, vol. 36, No. 5, pp. 777-783, 2001.

Perrott, M. et al., "A 27-mW CMOS fractional-N synthesizer using digital compensation for 2.5-Mb/s GFSK modulation," Solid-State Circuits, IEEE Journal of, vol. 32, No. 12, pp. 2048-2060, 1997.

Pun. K et al., "A 0.5-V 74-dB SNDR 25-kHz Continuous-Time Delta-Sigma Modulator With a Return-to-Open DAC," Solid-State Circuits, IEEE Journal of, vol. 42, No. 3, pp. 496-507, 2007.

Rhee, W. et al., "A 1.1-GHz CMOS fractional-N frequency synthesizer with a 3-b third-order Delta Sigma modulator," Solid-State Circuits, IEEE Jornal of, vol. 35, No. 10, pp. 1453-1460, 2000.

Rhee, W. et al., "An on-chip phase compensation technique in fractional-N frequency synthesis," Circuits and Systems, 1999. ISCAS '99. Proceedings of the 1999 IEEE International Symposium on, vol. 3, 1999.

Shen. J. et al., "A 0.5 V 8bit 10Msps Pipelined ADC in 90nm CMOS," VLSI Circuits, 2007 IEEE Symposium on, pp. 202-203, 2007.

Stanic, N. et al., "A 0.5 V 900 MHz CMOS Receiver Front End," VLSI Circuits, 2006. Digest of Technical Papers.2006 Symposium on, pp. 228-229. 2006.

Staszawski, R. et al., "A first multigigahertz digitally controlled oscillator for wireless applications," Microwave Theory and techniques, IEEE Transactions on, vol. 51, No. 11, pp. 2154-2164, 2003.

U.S. Appl. No. 60/920,906 filed Mar. 3, 2007.

U.S. Appl. No. 60/957,066 filed Aug. 21, 2007.

Vaucher, C, et al., "A family of low-power truly modular programmable dividers in standard 0.35-μm CMOS technology," Solid-State Circuits, IEEE Journal of, vol. 35, No. 7, pp. 1039-1045, 2000.

Wann, C. et al., "CMOS with Active Well Bias for Low-Power and RF/Analog Applications," VLSI Technology, 2000. Digest of Technical Papers. 2000 symposium on. pp. 158-159, 2000.

Wilson, W. et al., "A CMOS self-calibrating frequency synthesizer," Solid-State Circuits, IEEE Journal of, vol. 35, No. 10, pp. 1437-1444, 2000.

Yang, Y. et al., "A Quantization Noise Suppression Technique for," IEEE Journal of Solid-State Circuits, vol. 41, No. 11, pp. 2500-2511, 2006.

Yu, S. et al., "A 0.65 V 2.5 GHz fractional-N Frequency Synthesizer in 90nm CMOS," Digest of Technical Papers IEEE International Solid-State Circuits Conference (ISSCC), February, pp. 304-604, 2007.

* cited by examiner

US 7,884,658 B2

CIRCUITS FOR FORMING THE INPUTS OF A LATCH

CROSS REFERENCE TO RELATED APPLICATIONS

This application claims the benefit of U.S. Provisional Patent Applications Nos. 60/920,908, filed Mar. 30, 2007, and 60/957,066, filed Aug. 21, 2007, each of which is hereby incorporated by reference herein in its entirety.

TECHNICAL FIELD

The disclosed subject matter relates to circuits for forming the inputs of a latch.

BACKGROUND

Continuing decreases in the sizes and power requirements for electronic devices has resulted in a requirement for ever decreasing supply voltages for digital and analog circuits. For example, as more and more circuits are designed for implementation in scaled nanometer CMOS technologies, the supply voltages will continue to decrease from 1.2 V to 0.5 V. These decreasing supply voltages often have the added benefit of prolonging battery life in portable devices.

In order to address the decreasing supply voltages, it is desirable to provide circuit designs that operate on lower supply voltages.

SUMMARY

Circuits for forming the inputs of a latch are provided. In some embodiments, circuits for forming inputs of a latch comprise: a first transistor having a first gate terminal, a first drain terminal, a first source terminal, a first gate length, and a first common mode level at the first gate terminal, wherein the first gate terminal provides a data input to the latch; and a second transistor having a second gate terminal, a second drain terminal, a second source terminal, a second gate length, and a second common mode level at the second gate terminal, wherein the second gate terminal provides a clock input to the latch, the second drain terminal is coupled to the first source terminal, and the first gate length and the second gate length are sized so that the first common model level and the second common mode level are substantially equal.

In some embodiments, circuits for forming inputs of an AND gate and a latch comprise: a first transistor having a first gate terminal, a first drain terminal, a first source terminal, a first gate length, and a first common mode level at the first gate terminal, wherein the first gate terminal provides a first input to the AND gate; a second transistor having a second gate terminal, a second drain terminal, a second source terminal, a second gate length, and a second common mode level at the second gate terminal, wherein the second gate terminal provides a second input to the AND gate and the second drain terminal is coupled to the first source terminal; and a third transistor having a third gate terminal, a third drain terminal, a third source terminal, a third gate length, and a third common mode level at the third gate terminal, wherein the third gate terminal provides a clock input to the latch, the third drain terminal is coupled to the second source terminal, and the first gate length, the second gate length, and the third gate length are sized so that the first common model level, the second common mode level, and the third common mode level are substantially equal.

In some embodiments, methods for calibrating a tuning gain of a second port in a frequency synthesizer having a first port and the second port are provided, the methods comprising: setting the second port to a first input level; locking a loop in the frequency synthesizer to a known frequency; setting a reference level to a measured level at the first port; changing the second port to a second input level; changing the frequency of the frequency synthesizer; comparing a measured level at the first port to the reference level; and computing the tuning gain of the second port based on the change to the second port and the change to the frequency of the frequency synthesizer.

DETAILED DESCRIPTION

Figure 1:
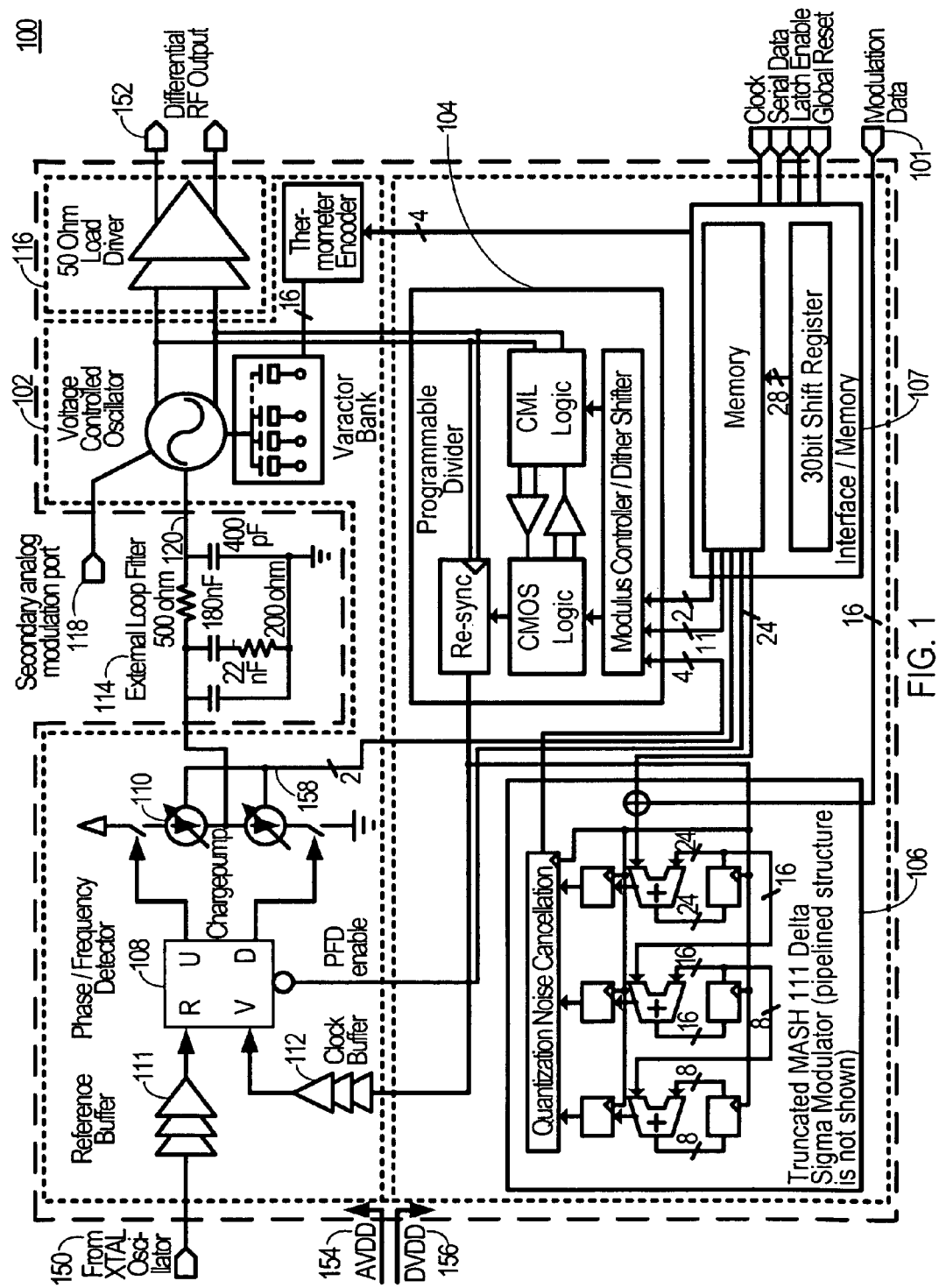
FIG. 1 is a diagram of a low-voltage, fractional-N frequency synthesizer in accordance with some embodiments.

In accordance with various embodiments, circuits for forming the inputs of a latch are provided. In some embodiments, low-voltage, fractional-N frequency synthesizers, such as a synthesizer 100 illustrated in FIG. 1, are provided. In some embodiments, a low-voltage, fractional-N frequency synthesizer can be used as a Frequency Shift Keying (FSK) modulator by modulating the data through the frequency control word according to a modulation data input 101. In some embodiments, a low-voltage, fractional-N frequency synthesizer can be used as a local oscillator. In some embodiments, the circuit can be implemented in a standard 90 nm CMOS process with one polysilicon and nine metal layers, and with only regular $V_T$ devices.

As can be seen from FIG. 1, synthesizer 100 can include a voltage controlled oscillator with programmable varactor bank 102, a programmable divider 104, a delta-sigma modulator 106, an interface/memory module 107 (which can be used to store configuration settings for use by the synthesizer), a phase/frequency detector 108, a charge-pump 110, buffers 111 and 112, a loop filter 114 (to filter the feedback signal to VCO 102; which filter can be external (as shown) or internal), and a load driver 116. Within these components, a control loop is formed for locking the synthesizer at a specified frequency.

As can also be seen from FIG. 1, one portion 154 of the synthesizer can operate using an analog power supply and another portion 156 can operate using a digital power supply.

To operate synthesizer 100 of FIG. 1, a reference frequency can be provided at point 150, clock, serial data, latch enable, and reset signals can be provided at the interface/memory 107, modulation data can be provided at input 101, and a differential load provided at output 152. Any suitable reference frequency source can be used, such as a crystal oscillator, in some embodiments.

Figure 2:
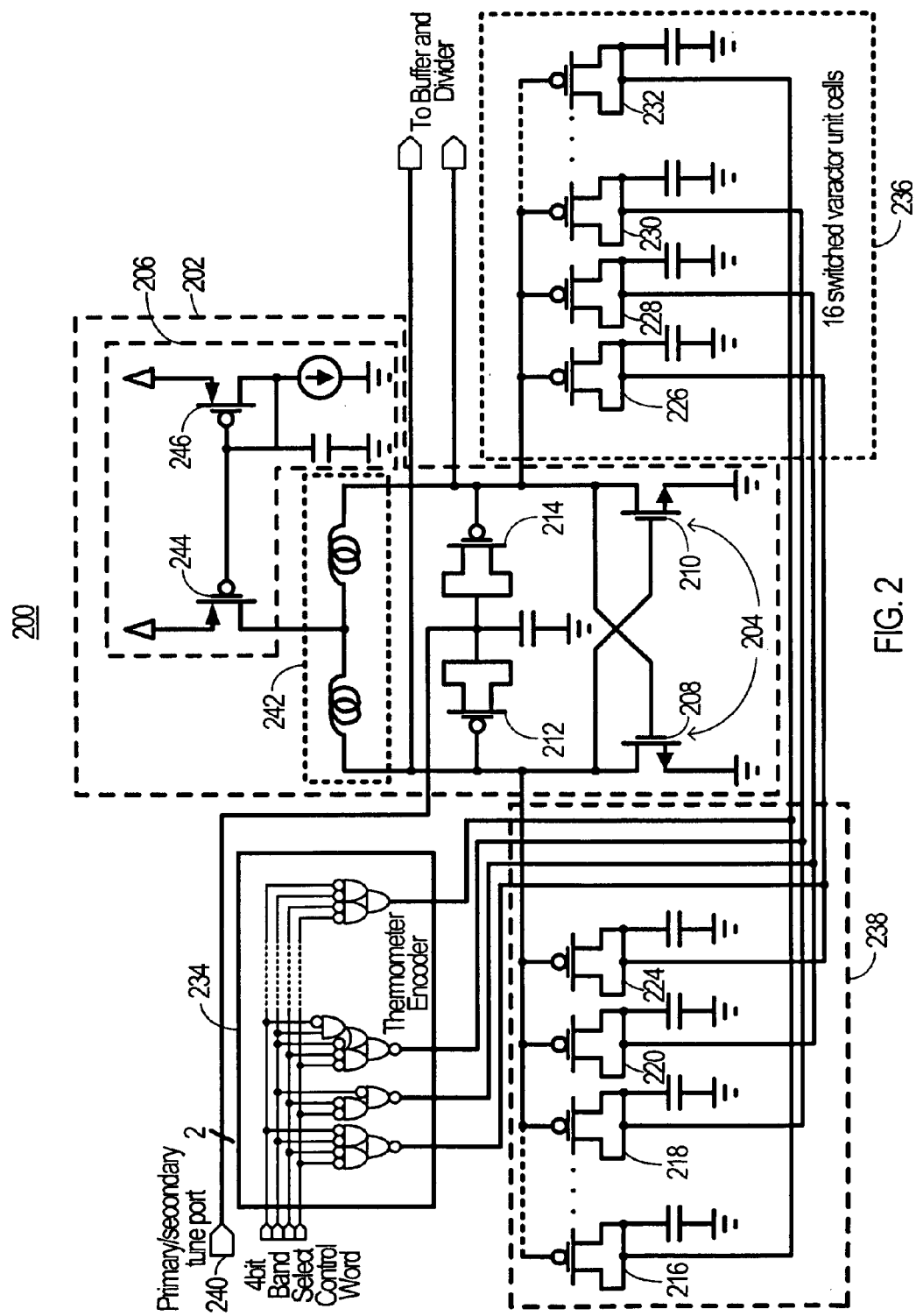
FIG. 2 is a diagram of a voltage controlled oscillator in accordance with some embodiments.

One embodiment of a voltage controlled oscillator 200 that can be used in some embodiments as VCO 102 of FIG. 1 is illustrated in FIG. 2. As shown, VCO 200 includes a biasing scheme based on a top-biased topology 202 in which the common-mode of a cross-coupled pair 204 is designed to be about half of its supply voltage by sizing NMOS switching transistors 208 and 210 and a PMOS current mirror 206 so that all of the internal nodes are kept in between the power supply voltage and ground which can improves long-term circuit reliability. In some embodiments, this VCO can be implemented with only regular $V_T$ devices. For example, when the VCO operates from a 0.5 V power supply, there can be at least 250 mV available across PMOS current source 244, which can cause transistor 244 to operate in the saturation region.

A hybrid tuning scheme that can be used in VCO 200 can include discrete and continuous parts in some embodiments. The switched varactors in regions 236 and 238 (e.g., varactors 216, 218, 220, 224, 226, 228, 230, and 232) can be used as capacitances for discrete frequency tuning. Although only four varactors are illustrated in each of regions 236 and 238, each of these regions can have any suitable number of varactors. For example, each region can contain 16 varactors in some embodiments.

The tuning nodes of the varactors in regions 236 and 238 can be driven by logic signals from thermometer encoder 234. The size of thermometer encoder 234 can be modified to correspond to the number of varactors in regions 236 and 238. These logic signals can switch the varactors between two discrete states—high capacitance and low capacitance. The varactors can be implemented with inversion mode PMOS transistors whose gate nodes are connected to the LC tank while source and drain nodes are shorted and connected to the outputs of thermometer encoder 234.

Varactors 212 and 214 can be used to form variable capacitances for the continuous part of the hybrid tuning scheme. The varactors can be implemented with inversion mode PMOS transistors whose gate nodes are connected to the inductors and the cross-coupled transistors, while source and drain nodes are shorted and connected to the feedback tuning voltage 240 from the loop filter (see FIG. 1). In some embodiments, while the tuning voltage increases from 200 mV to 500 mV, the source-gate voltage across varactors 212 and 214 can change from 50 mV to 250 mV, and thus the PMOS varactors can be biased from the depletion region (low capacitance) toward the inversion region (high capacitance).

The varactors in regions 236 and 238 can be laid-out using unit cells, which can have a width of 20 um, a length of 0.4 um, and a threshold voltage of 150 mV. Varactors 212 and 214 can be laid out using unit cells which have a width of 80 um, a length of 0.4 um, and a threshold voltage of 150 mV. Transistors 208 and 210 can be laid out using unit cells which have a width of 50 um and a length of 0.25 um. Transistor 244 can be laid out using unit cells which have a width of 1500 um and a length of 0.5 um.

The use of switched varactors as described above can lead to a compact layout and a better matching between the discrete and continuous tuning parts.

As shown in FIG. 2, VCO 200 can also include a 4.5 nH, six-turn, center-tapped symmetric inductor 242 that is constructed using metal-9 and metal-8 in parallel. The inductor can be designed to have an even number of turns to minimize the effect of parasitic looping formed by the power rails outside the LC tank. Inductor 242 along with varactors 212 and 214, varactors 216, 218, 220, 224, 226, 228, 230, and 232, and the parasitic capacitance of the negative resistance formed by transistors 208 and 210 can be used to form the LC tank.

Figure 3:
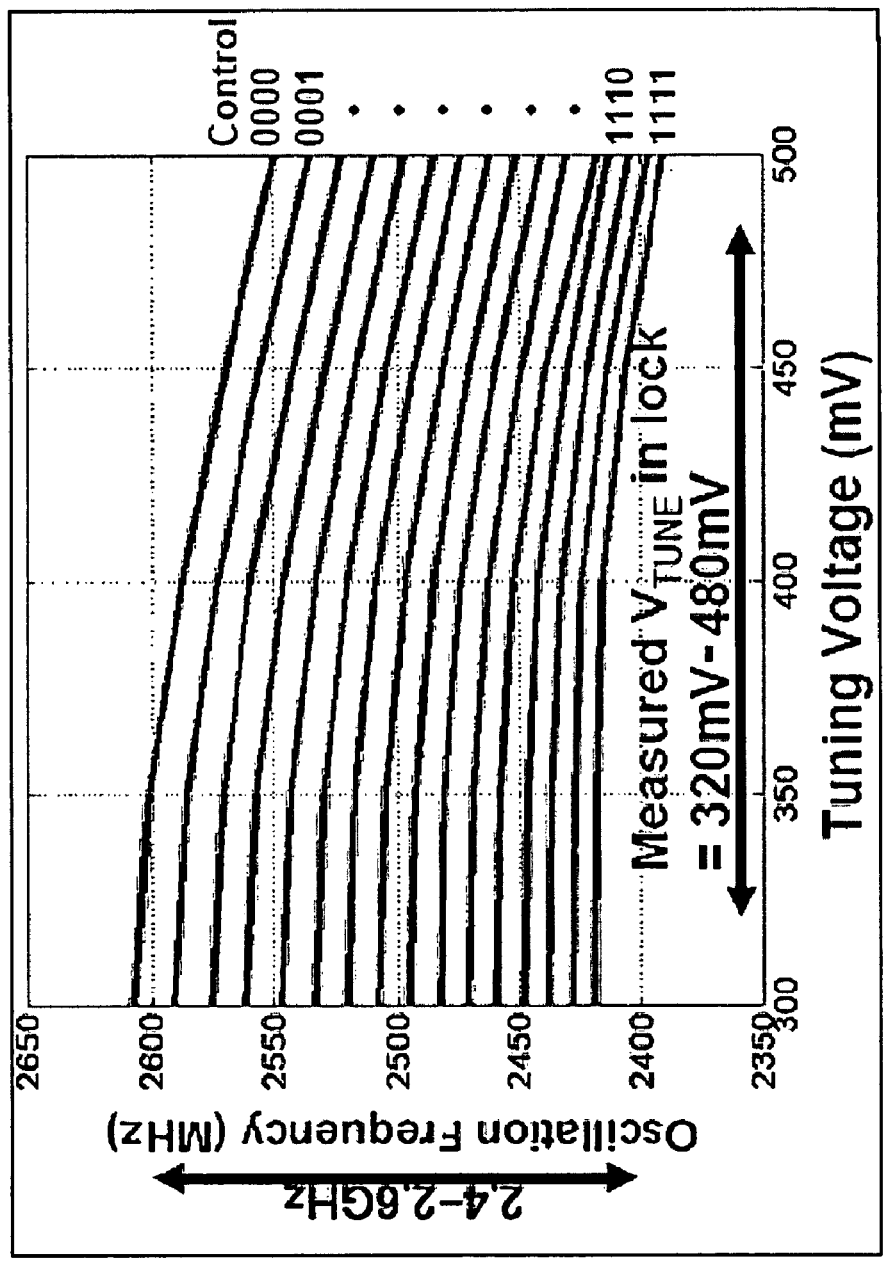
FIG. 3 is a diagram showing relationships between oscillation frequency and tuning voltage in a voltage controlled oscillator in accordance with some embodiments.

In some embodiments, the VCO can nominally drain a bias current of 4 mA from a 0.5 V supply and can be tuned from 2.4 GHz to 2.6 GHz with 16 discrete settings of the varactors in regions 236 and 238 as shown in FIG. 3.

In some embodiments, the tuning range of the continuous part, which can be composed of eight unit varactor cells, can vary from 25 MHz to 60 MHz with different settings, and the tune voltage while in lock can vary from 320 mV to 480 mV.

Figure 4A:
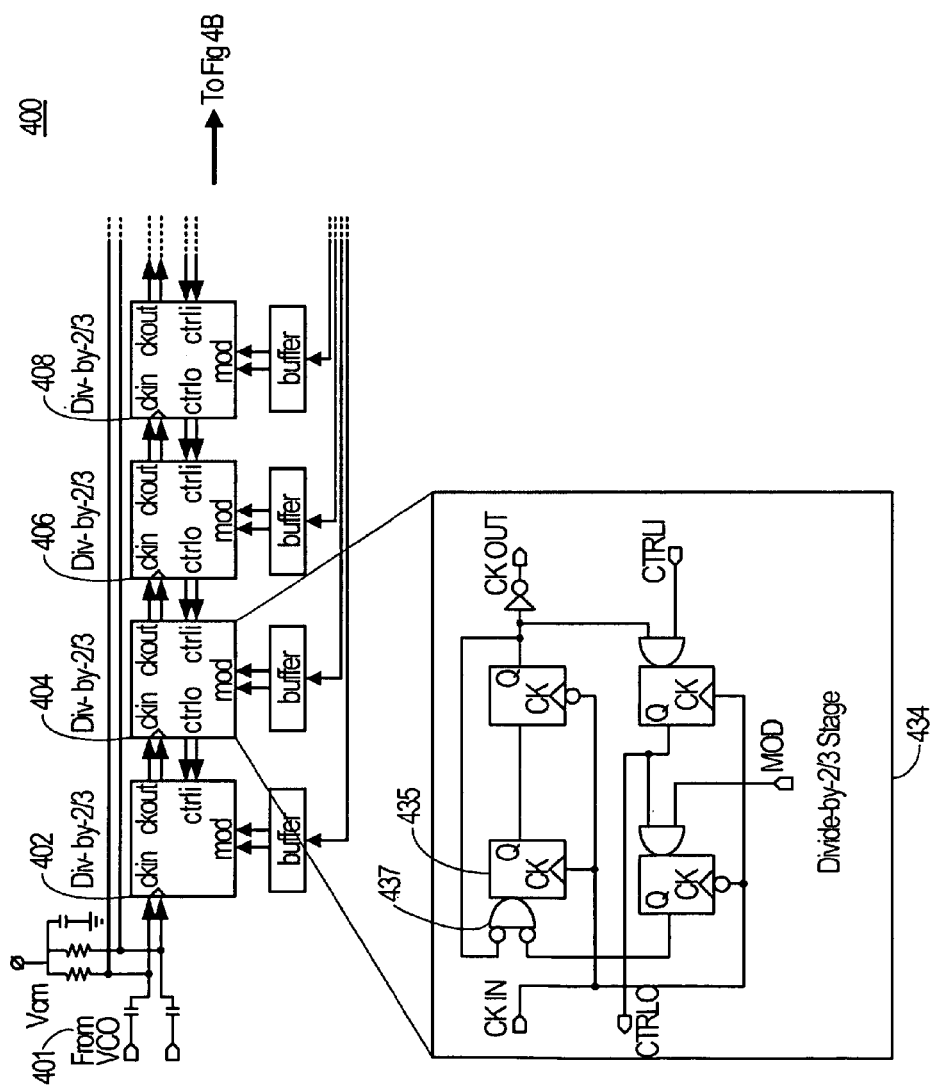
FIG. 4 is a diagram of a programmable divider in accordance with some embodiments.
Figure 4B:
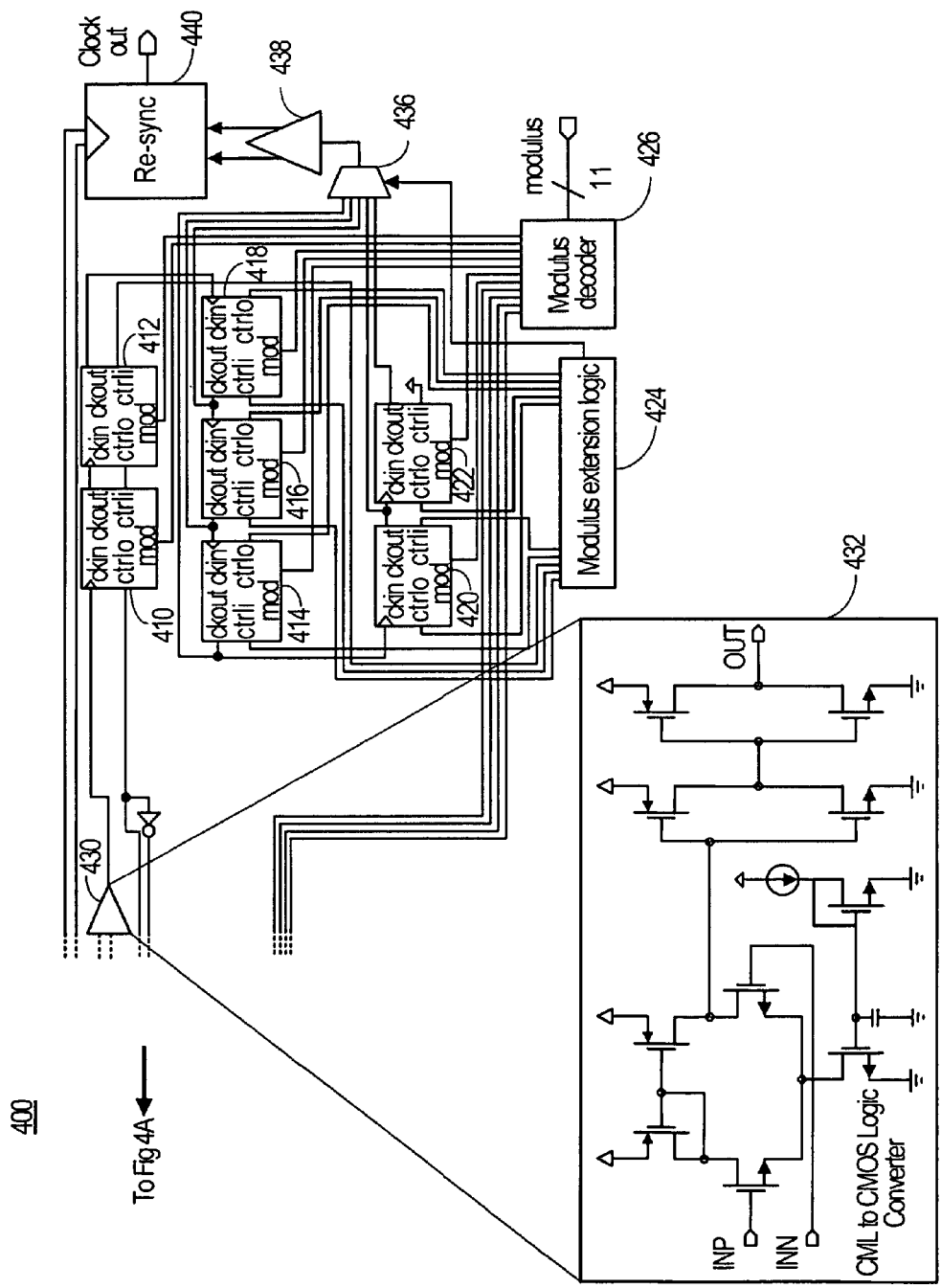

Turning to FIG. 4, a programmable divider 400 that can be used in some embodiments as programmable divider 104 of FIG. 1 is illustrated. Programmable divider 400 can be implemented using a high frequency front-end section and a low frequency back-end section, which can be implemented using current-mode logic (CML) and standard CMOS logic, respectively. Programmable divider 400 adopts a modular architecture using a cascade of divide-by-⅔ stages 402, 404, 406, 408, 410, 412, 414, 416, 418, 420, and 422, which can each be constructed logically as illustrated by diagram 434. Although eleven total stages are illustrated, any suitable number of stages can be used in some embodiments. Because the clock in each stage is halved compared to its preceding stage, each stage can also be scaled and optimized for lower power consumption in some embodiments. As shown, the front-end section includes cascaded current-mode logic divide-by-⅔ divider cells 402, 404, 406, and 408, and can receive a feedback signal from a VCO at input 401 (e.g., as illustrated in FIG. 1) and divide it down. For example, the front end can receive a 2.5 GHz feedback signal and divide it down to about 150 MHz. The back-end section includes seven cascaded CMOS divide-by-⅔ divider cells 410, 412, 414, 416, 418, 420, and 422, modulus extension logic 424, and modulus decoder 426, and can further divide the feedback signal down (e.g., to about 16 MHz). The dividers can be connected to a digital $V_{DD}$ of 0.65V.

To bridge the common mode logic (CML) to CMOS logic of the front end and back end, respectively, a CML to CMOS logic converter 430 can be provided between the front end and the back end. Converter 430 can be constructed as illustrated in diagram 432 of FIG. 4.

Figure 5:
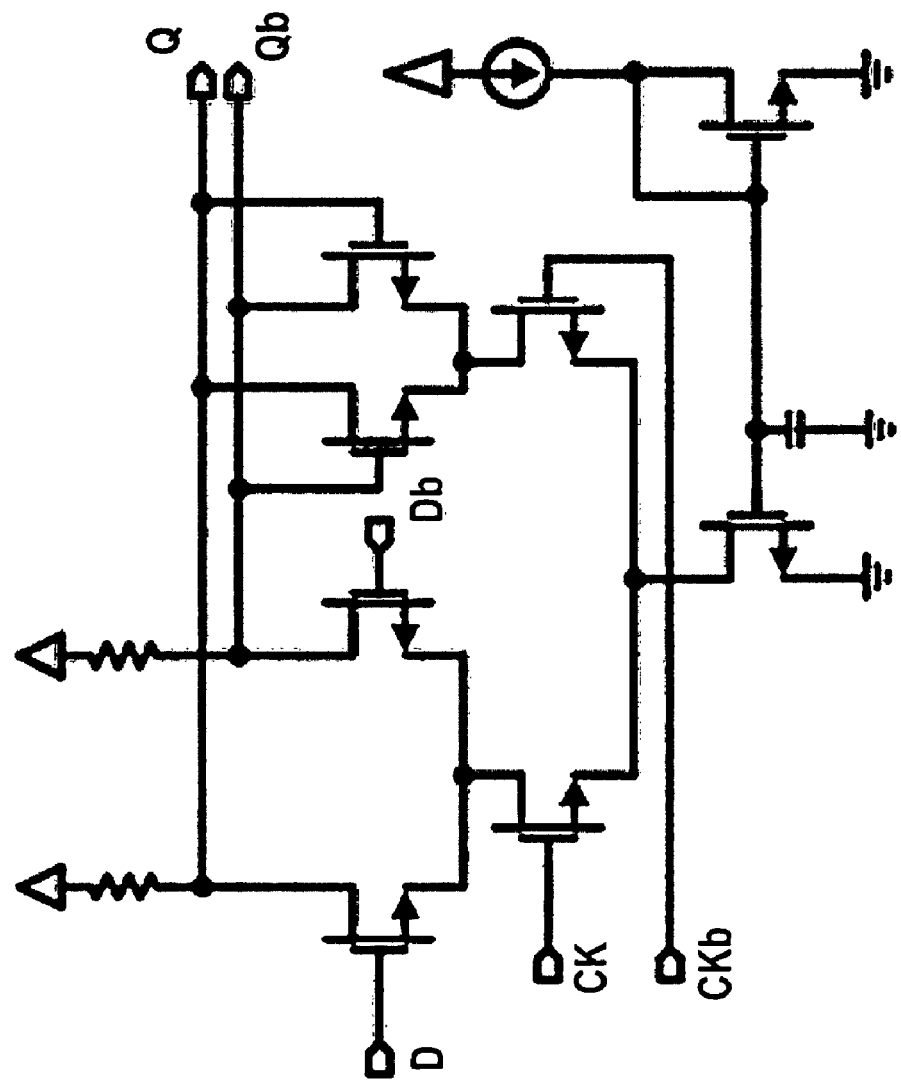
FIG. 5 is a diagram of a latch in accordance with some embodiments.

In some embodiments, a latch (such as latch 435) in the current-mode logic of FIG. 4 can be implemented as illustrated in FIG. 5. In some embodiments, the components shown in FIG. 5 can be operated in moderate to strong inversion in order to obtain sufficient $f_T$ for high-speed operation. For example, with a supply of 0.65 V, the output DC level at Q and Qb can be chosen to be 0.5 V to provide a swing of 150 mV single-ended. Since the clock (CK and CKb) and data (D and Db) inputs can be connected to the outputs from other cells with 0.5 V output DC level, the DC common mode level at all inputs can also be 0.5 V.

Figure 6A:
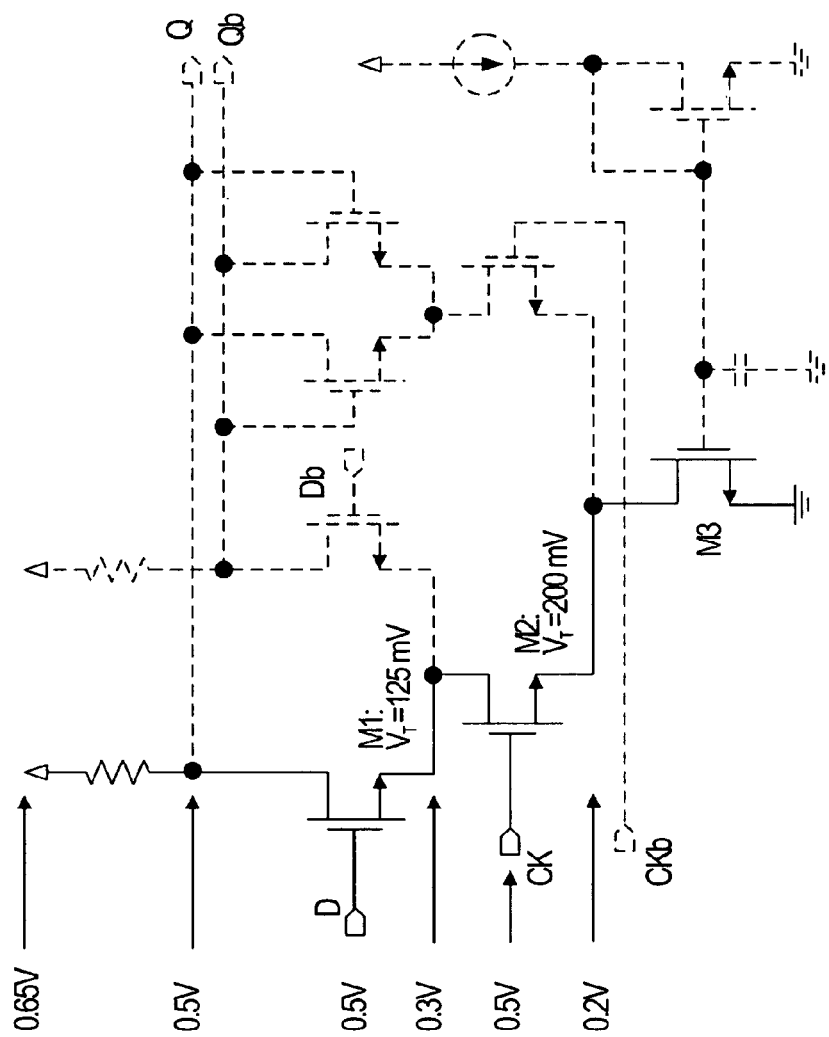
FIGS. 6(a), 6(b), and 6(c) are diagrams showing threshold voltage ($V_T$) values, gate lengths, and forward body biases of latch transistors in accordance with some embodiments.
Figure 6B:
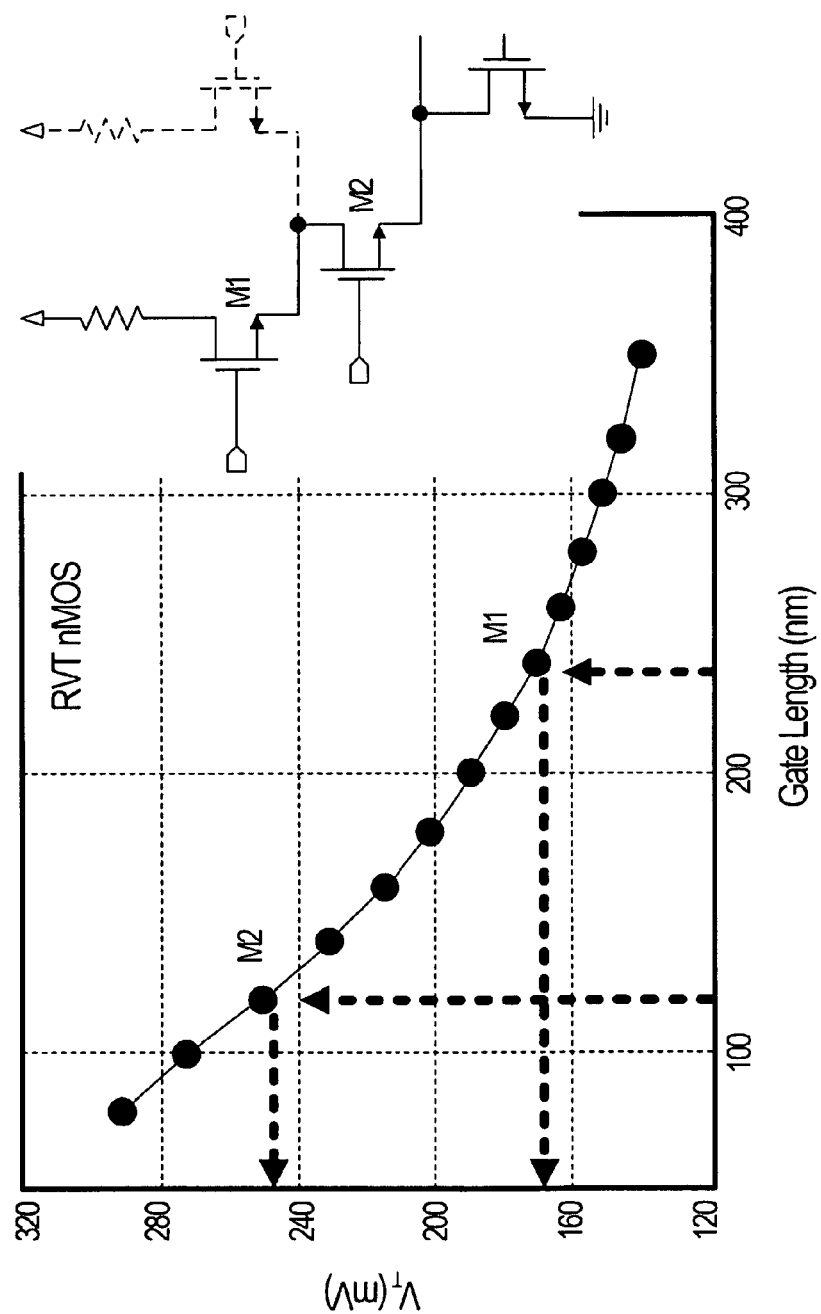
Figure 6C:
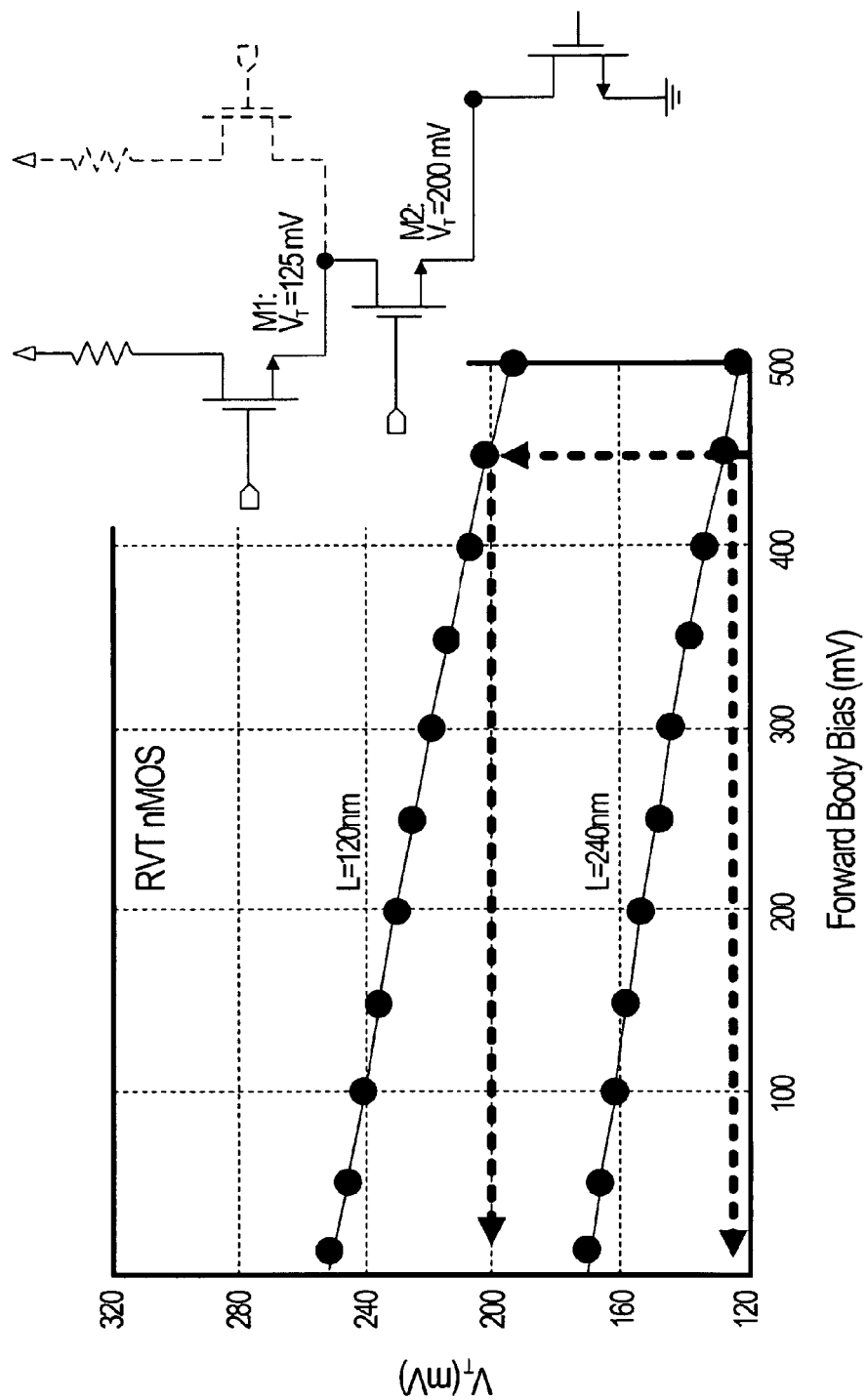

Examples of node bias voltage levels of the current-mode latch of FIG. 5 that can be used in some embodiments are illustrated in FIGS. 6(a), 6(b), and 6(c). As shown in FIG. 6(a), the current source transistor M3 can be designed to have a $V_{DS}$ of 200 mV to operate in the saturation region. The transistor M1 can be designed to have an overdrive of 75 mV, while the clock transistor M2 can be designed to have an overdrive of 100 mV for a higher speed requirement. In order to meet these designed overdrive voltages, the $V_T$ of M1 can be 125 mV, while the $V_T$ of M2 can be 200 mV. In some embodiments, when the biasing constraints are satisfied, the latch can operate from a supply voltage as low as 0.5 V with the required swing and with a current source at its tail.

A technique that can be used to adjust the threshold voltage ($V_T$) of NMOS devices is to make use of the reverse short channel effect. For instance, in a 90 nm CMOS technology, by increasing the length of the NMOS transistor from 90 nm to 350 nm, the nominal threshold voltage can be reduced from 300 mV to about 140 mV as illustrated in FIG. 6(b). Transistor M1 can be sized to have a length of 240 nm, while transistor M2 can be sized to have a length of 120 nm with slightly higher $V_T$. To further adjust the $V_T$ of the devices, forward body bias can be applied to all the NMOS transistors in the current-mode logic gates and deep N-well isolation can be used to isolate different P-bodies biased by different voltages. In FIG. 6(c), the nominal $V_T$ of NMOS transistors with the length of 120 nm and 240 nm is plotted versus body-source voltage, $V_{BS}$. To have an additional 50 mV of $V_T$ reduction, a 450 mV forward body bias can be applied to the transistors in the current-mode logic gates. Thus, the fully differential latch can be sized to have transistor M1 be 240 nm long with 125 mV $V_T$ and transistor M2 be 120 nm long with 200 mV $V_T$.

In addition to the latches illustrated in FIGS. 5 and 6, each divide-by-⅔ cell illustrated in diagram 434 of FIG. 4 also requires AND gates, such as AND gate 437. If an AND gate is implemented as a separate gate, doing so can introduce extra delay which degrades the maximum speed of the divider. Thus, in accordance with some embodiments, an AND gate 700 can be combined with the latch circuitry illustrated above and constructed as shown in FIG. 7(a).

In some embodiments, in the first divide-by-⅔ stage, the cross-coupled latch transistor pairs 702 and 704 are sized smaller than the logic transistors 706 and 708 and its clock port 710 is DC biased to set its self-oscillation frequency between 2 and 3 GHz, which can maximize the divider sensitivity over the VCO operation range. In some embodiments, the power scaling factor along the cascade of stages is 0.7 rather than 0.5 in order to leave enough margin for parasitics which cannot be scaled.

Figure 7A:
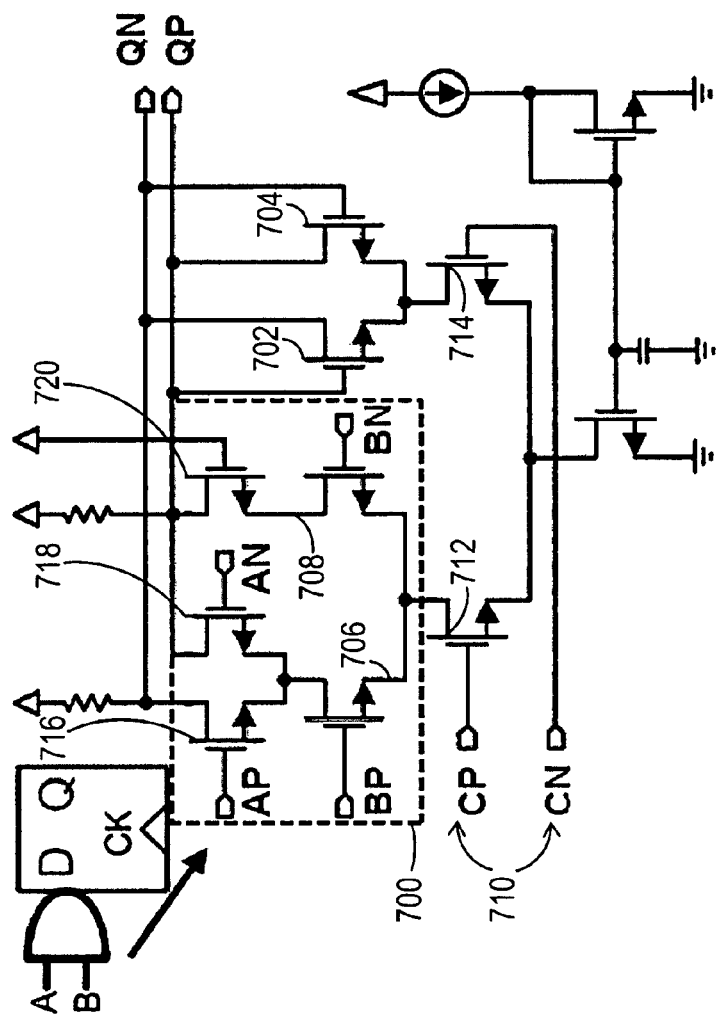
FIGS. 7(a) and 7(b) are diagrams of an AND gate integrated with a latch in NMOS and PMOS technologies accordance with some embodiments.

In some embodiments, the transistors in FIG. 7(a) can be sized so that transistors 712 and 714 have lengths of 120 nm and transistors 706, 708, 716, 718, and 720 have lengths of 240 nm. As described in connection with FIG. 6(b), such lengths can cause the threshold voltages of these transistors to permit operation off a low supply voltage, such as 0.65 V.

Figure 7B:
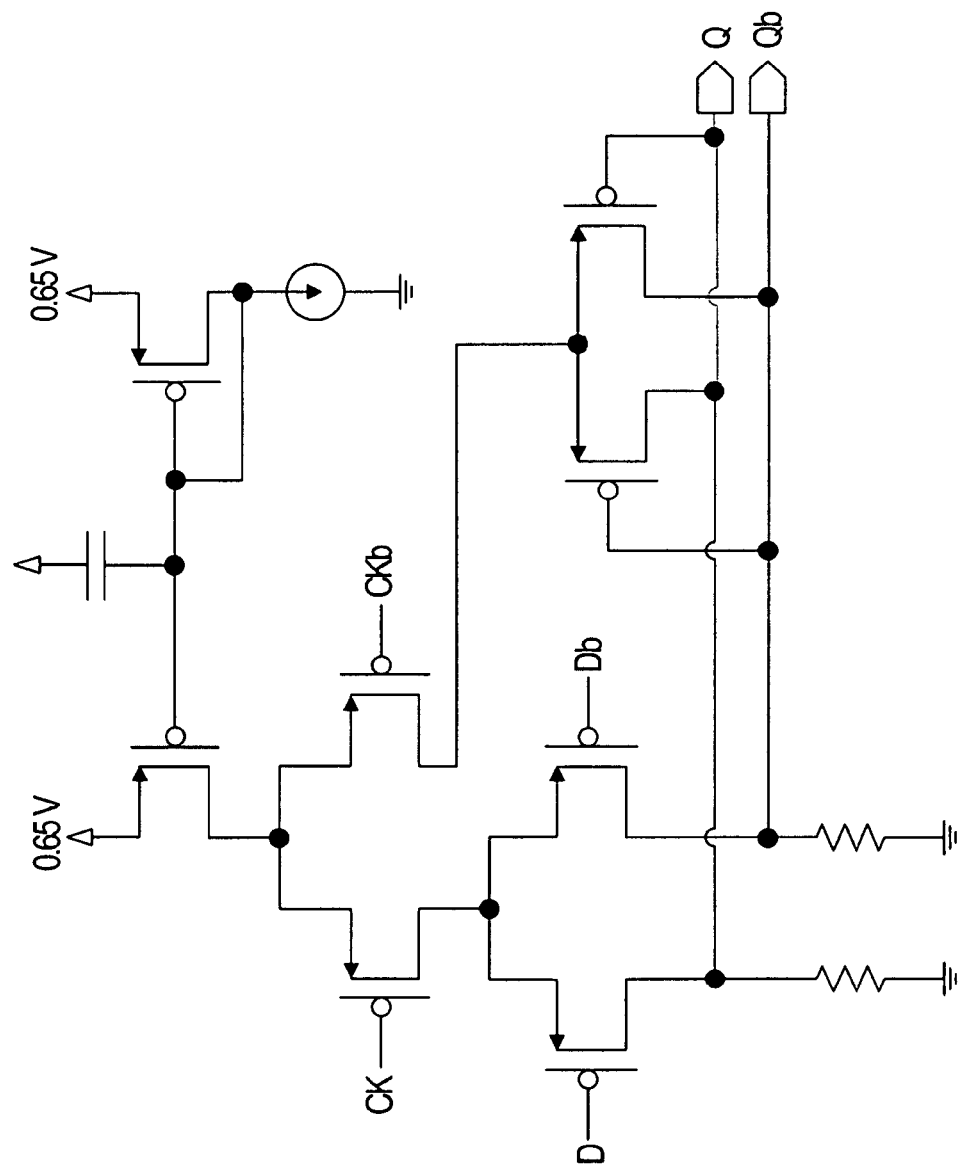

A PMOS version of the circuit of FIG. 7(a) can be implemented as illustrated in FIG. 7(b) in accordance with some embodiments.

As mentioned above, the back-end divider section is also based on the cascade of divide-by-⅔ cells. Since the division ratio of a cascaded truly modular divider can be formulated as N=2M+K, K=0 to 2M−1, where M is the number of cascaded stages, making the number of cascades reconfigurable can extend the available modulus range. In some embodiments, modulus extension logic 424 and modulus decoder 426 can be used to reconfigure the number of cascades by providing a programmable interconnecting mechanism for the CTRLO and CTRLI terminals of stages 414, 416, 418, 420, and 422.

Due to the cascade nature of the divider architecture, delay uncertainty can introduce extra jitter that is accumulated along the chain of divider cells. Accordingly, in some embodiments, a re-timing circuit formed by 436, 438, and 440 as shown in FIG. 4 can be used to retime the divider output signal to the VCO output signal and eliminate this divider jitter. The divided signal (output of 436) (which can have a standard CMOS logic level) can then be converted back to a differential signal by buffer 438 and fed into a current-mode latch 440 which is triggered by the original VCO signal.

In order to synthesize frequencies with steps finer than the reference clock in low-voltage, fractional-N frequency synthesizers, a digital delta-sigma modulator can be used to modulate the modulus control word and generate a sequence of over-sampled words to control the integer programmable divider. Through changing the instantaneous integer division ratio controlled by the modulated words, the equivalent ratio can be made fractional and the phase spectrum of the divided signal can be properly shaped to have a high-pass characteristic. In some embodiments, a MASH-1-1-1 architecture can be used for the delta-sigma modulator. This architecture can include a cascade of first order delta-sigma modulators, which can be equivalent to digital accumulators with fixed length, and, therefore, can be scalable for different orders.

Figure 8:
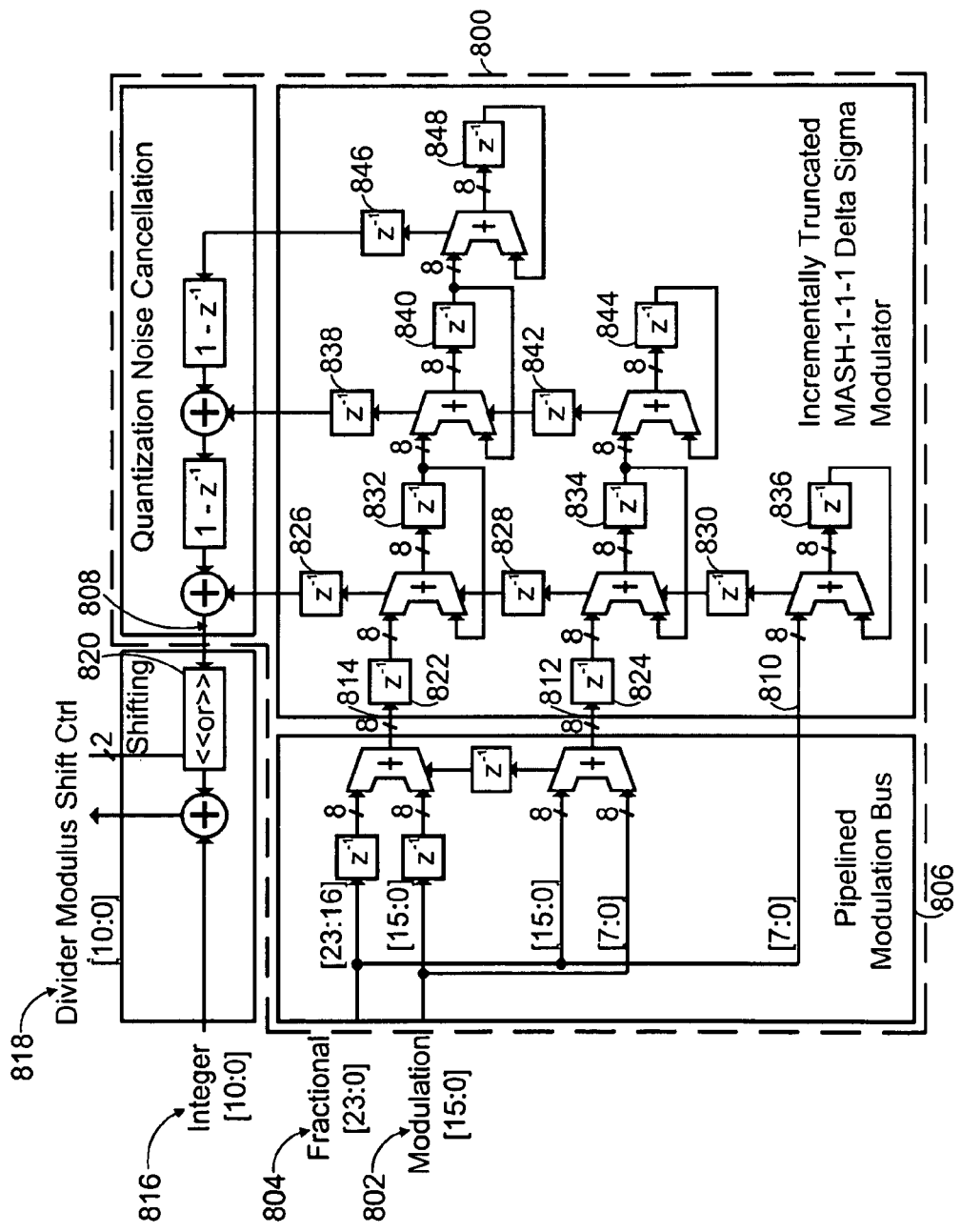
FIG. 8 is a diagram of a delta sigma modulator in accordance with some embodiments.

Turning to FIG. 8, a delta-sigma modulator 800 that is based on a MASH-1-1-1 architecture and that can be used in some embodiments as delta-sigma modulator 106 of FIG. 1 is illustrated.

During operation of modulator 800, a 16-bit long data path 802 is summed to a 24-bit fractional part 804 of a modulus control word by a pipelined adder 806. The modulator then modulates the 24-bit fractional sum at points 810, 812, and 814 into an over-sampled 4-bit (in 2s complement format) word sequence at point 808, and then this sequence is summed with an 11-bit integer number 816. The resulting 11-bit modulated modulus control word 818 can then be applied to the current-mode logic (CML) and the CMOS logic divider stages (shown in FIG. 4).

To reduce the hardware in the modulator to save power and reduce switching noise coupled to the substrate, the content stored in registers 822, 824, 826, 828, 830, 832, 834, 836, 838, 840, 842, 844, 846, and 848, which is the residual quantization error in each section, can be truncated to lower resolution in some embodiments. This truncation can provide a result that is similar to adding extra quantization error to the input of truncated sections, and can introduce a mismatch when quantization error cancellation is performed.

In some embodiments, the divider modulus 818 is modulated over a range from N+4 to N−3 in a noise shaped fashion and results in a non-integer division ratio between N+1 and N. With 24-bit fractional resolution, the frequency synthesis can give a step size below 4 Hz with a reference frequency of 16 MHz. However, this arrangement can lead to a significant increase in phase noise on the synthesizer output spectrum at higher offset frequencies. This is because switching by the noise-shaped bit stream on the modulus of the divide-by-⅔ cells can cause a switching current noise coupling through the substrate with higher sensitivity due to the forward body bias. As a result, the VCO can be contaminated by switching interference, especially from the divider cells with larger bias currents.

To address this problem, in some embodiments, the dithering bits of the digital modulator can be shifted to later bits by shifter 820 (as controlled by shift control 822), resulting in a multiplication of the modulated word stream by powers of two. Given that the first two stages 402 and 404 of the programmable divider (as shown in FIG. 4) can consume higher power for high-speed operation, the dithering can be shifted to start from the third stage 406 (FIG. 4) to prevent it from switching the high power stages, and the modulus control word can then be changed over a range from N+16 to N−12 by the modulator. However, this shifting can result in a higher level of phase noise due to the larger quantization noise. This additional noise can be outside of the bandwidth of loop filter 114 (FIG. 1) and can be properly rejected with an appropriate loop filter design with higher attenuation. For applications requiring medium phase noise performance, such as a BLUETOOTH transceiver, the increase in quantization noise may not cause significant degradation of phase noise, but this dithering re-arrangement can effectively avoid the substrate noise injection into the forward-biased body.

Figure 9:
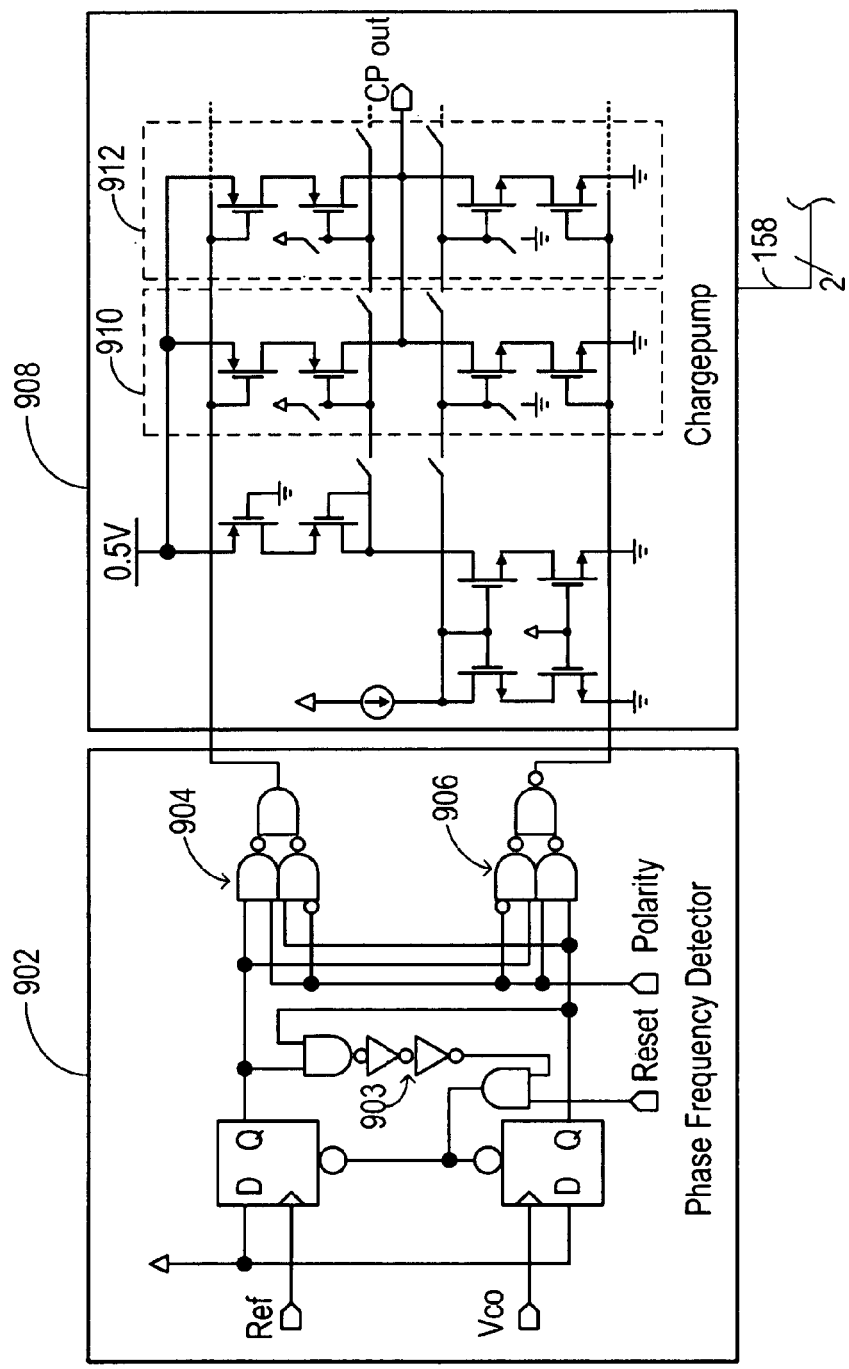
FIG. 9 is a diagram of a phase frequency detector and a charge-pump in accordance with some embodiments.

An asynchronous tri-state phase and frequency detector (PFD) 902 that can be used in some embodiments as phase/frequency detector 108 of FIG. 1 is shown in FIG. 9. As illustrated in FIG. 9, one or more delay cells 903 which can correspond to about a 1 ns delay time can be inserted in the feedback of the PFD in order to increase the on-state pulse width to prevent a dead-zone problem due to the finite turn-on time of the charge-pump current. As also illustrated in FIG. 9, the output of the PFD can be multiplexed by devices 904 and 906 to provide dual polarity for flexibility of loop filters.

A charge-pump circuit 908 that can be used in some embodiments as charge-pump 110 of FIG. 1 is also shown in FIG. 9. As illustrated, charge-pump circuit 908 can use a source switch topology, in which multiple stages 910 and 912 of the charge pump can be provided. Although only two stages 910 and 912 are shown in FIG. 9 for simplicity, any suitable number of stages (e.g., such as four) can be provided. The switching of the stages can be implemented progressively so that, initially, only the first stage is engaged, then the first and second stages are engaged, then the first, second, and third stages are engaged, and then the first, second, third, and fourth stages are engaged. This switching can be controlled by interface/memory module 107 via control lines 158.

In accordance with some embodiments, a technique for wideband data transmission that can be used with low-voltage, fractional-N frequency synthesizers can be referred as two-point modulation. In two-point modulation, modulation data applied to the divider control word sees a low-pass characteristic while data applied at the VCO tune node sees a high-pass characteristic. The low-pass and high-pass paths can be combined to reconstruct an all-pass channel for data transmission. This architecture is suitable for integration since the low-pass data path can be built into the divider modulus control, and an additional DAC can be implemented to convert the digitally modulated data to an analog voltage signal to modulate the VCO tune node for the high-pass modulation path.

More specifically, in some embodiments, modulation port 101 of FIG. 1 can receive digital modulation data and see a low-pass characteristic while the VCO has a secondary tuning port 118 that can receive analog modulation data from a DAC and see a high-pass characteristic. If the data is fed to both ports at the same time, the modulation data will see an all-pass transfer function. In an FSK system, the frequency deviation is usually given implicitly with the modulation index or β. If the bandwidth of the modulation data is smaller than the bandwidth of the loop formed by the synthesizer (which means it can be applied to the digital data port only), the frequency deviation can be well controlled through the division modulus since the reference frequency is a known parameter. In the case of two-point modulation, however, the transfer function of the high-pass modulation path will be related with the combination of DAC and VCO tuning gain, which can be difficult to control. Therefore, the modulation can be affected by the resulting gain mismatch between the two paths.

Figure 10:
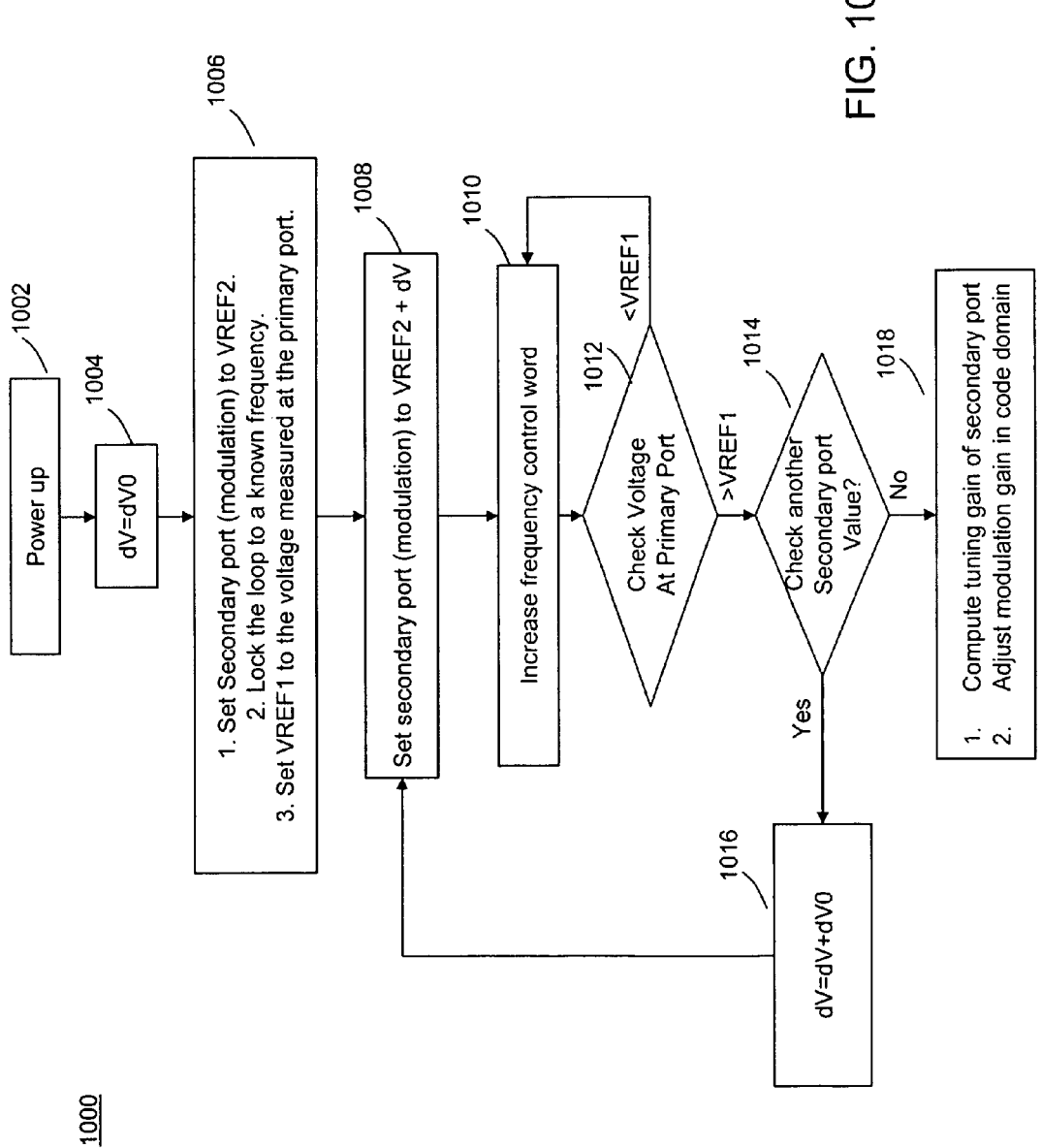
FIG. 10 is a diagram of a calibration procedure in accordance with some embodiments.

In some embodiments, the gain mismatch can be calibrated through a procedure 1000 illustrated in FIG. 10. First, the synthesizer can be powered-up at 1002. Next, at 1004, a voltage increase amount to be supplied to the secondary modulation port (118 of FIG. 1) can be initialized. At 1006, the secondary modulation port can be set to $V_{REF2}$ (which can be any suitable value), the loop can be locked to a known frequency, and a value $V_{REF1}$ can be set to the voltage measured on the primary tuning port. Then, at 1008, the secondary tuning port modulation value can be increased by a known increment. At 1010, the frequency control word of the synthesizer can be increased. Then, at 1012, the voltage at the primary port can be measured and compared to $V_{REF1}$. If the voltage is less than $V_{REF1}$, procedure 1000 can loop back to 1010 and the frequency control word can be increased again. If the voltage is more than $V_{REF1}$, procedure 1000 can check at 1014 whether any other secondary port values are to be checked. If so, then the secondary port increment can be increased at 1016 and procedure 1000 will loop back to 10008. If not, then the tuning gain of the secondary port can be computed, and the modulation gain in the code domain adjusted, at 1018.

The procedure illustrate in FIG. 10 can be implemented in some embodiments using on-chip components, such as suitable logic and an analog to digital converter for measuring voltages ports 118 and 120 of FIG. 1.

Apart from the gain mismatch, there can also be path delay mismatch which can come from latency from the DAC and the pipeline. To address this, additional registers can be inserted in some embodiments after a Gaussian filter used to drive the synthesizer to add a delay, and/or the data used to drive the two inputs can be phased to compensate for delay.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for forming inputs of a latch, comprising:
a first transistor having a first gate terminal, a first drain terminal, a first source terminal, a first gate length, and a first common mode level at the first gate terminal, wherein the first gate terminal provides a data input to the latch; and
a second transistor having a second gate terminal, a second drain terminal, a second source terminal, a second gate length, and a second common mode level at the second gate terminal, wherein the second gate terminal provides a clock input to the latch, the second drain terminal is coupled to the first source terminal, and the first gate length and the second gate length are sized so that the first common mode level and the second common mode level are substantially equal and the first transistor and the second transistor use the reverse short channel effect.

2. The circuit of claim 1, wherein the first gate length is around 240 nm and the second gate length is around 120 nm.

3. The circuit of claim 1, wherein the first transistor has a first threshold voltage of around 125 millivolts and the second transistor has a second threshold voltage of around 200 millivolts.

4. The circuit of claim 1, wherein the second transistor also includes a body terminal that is forward biased.

5. The circuit of claim 4, wherein the body terminal is forward biased by around 450 millivolts.

6. The circuit of claim 1, further comprising a third transistor having a third gate terminal, a third drain terminal, and a third source terminal, wherein the third drain terminal is coupled to the second source terminal and the third source terminal is coupled to a ground.

7. The circuit of claim 1, further comprising a resistor having a first terminal coupled to a supply voltage and a second terminal coupled to an output of the latch and the first drain terminal.

8. The circuit of claim 1, wherein the first transistor and the second transistor form inputs to a latch in a divide-by-⅔ stage.

9. The circuit of claim 8, wherein the divide-by-⅔ stage is part of a fractional-N frequency synthesizer.

10. A circuit for forming inputs of an AND gate and a latch, comprising:
    a first transistor having a first gate terminal, a first drain terminal, a first source terminal, a first gate length, and a first common mode level at the first gate terminal, wherein the first gate terminal provides a first input to the AND gate;
    a second transistor having a second gate terminal, a second drain terminal, a second source terminal, a second gate length, and a second common mode level at the second gate terminal, wherein the second gate terminal provides a second input to the AND gate and the second drain terminal is coupled to the first source terminal; and
    a third transistor having a third gate terminal, a third drain terminal, a third source terminal, a third gate length, and a third common mode level at the third gate terminal, wherein the third gate terminal provides a clock input to the latch, the third drain terminal is coupled to the second source terminal, and the first gate length, the second gate length, and the third gate length are sized so that the first common mode level, the second common mode level, and the third common mode level are substantially equal.

11. The circuit of claim 10, wherein the first gate length and the second gate length are around 240 nm and the third gate length is around 120 nm.

12. The circuit of claim 10, wherein the first transistor has a first threshold voltage of around 125 millivolts, the second transistor has a second threshold voltage of around 125 millivolts, and the third transistor has a third threshold voltage of around 200 millivolts.

13. The circuit of claim 10, wherein the third transistor also includes a body terminal that is forward biased.

14. The circuit of claim 13, wherein the body terminal is forward biased by around 450 millivolts.

15. The circuit of claim 10, further comprising a fourth transistor having a fourth gate terminal, a fourth drain terminal, and a fourth source terminal, wherein the fourth drain terminal is coupled to the third source terminal and the fourth source terminal is coupled to a ground.

16. The circuit of claim 10, further comprising a resistor having a first terminal coupled to a supply voltage and a second terminal coupled to an output of the latch and the first drain terminal.

17. The circuit of claim 10, wherein the first transistor and the second transistor form inputs to an AND gate and a latch in a divide-by-⅔ stage.

18. The circuit of claim 17, wherein the divide-by-⅔ stage is part of a fractional-N frequency synthesizer.

19. A method for calibrating a tuning gain of a second port in a frequency synthesizer having a first port and the second port, comprising:
    setting the second port to a first input level;
    locking a loop in the frequency synthesizer to a known frequency corresponding to the first input level so that a voltage in the frequency synthesizer repeatedly passes between two levels while the loop is locked;
    setting a reference level to a measured level at the first port;
    changing the second port to a second input level;
    changing the frequency of the frequency synthesizer;
    comparing a measured level at the first port to the reference level; and
    computing the tuning gain of the second port based on the change to the second port and the change to the frequency of the frequency synthesizer.

* * * * *